(12) United States Patent
Secall et al.

(10) Patent No.: US 6,790,051 B1
(45) Date of Patent: Sep. 14, 2004

(54) CONNECTOR FOR PRINTED CIRCUIT BOARD

(75) Inventors: Xavier Secall, Valls (ES); Jordi Bigorra, Valls (ES); Gerard Vall, Valls (ES); Jordi Sanchez, Valls (ES)

(73) Assignee: Lear Corporation, Southfield, MI (US)

( * ) Notice: Subject to any disclaimer, the term of this patent is extended or adjusted under 35 U.S.C. 154(b) by 4 days.

(21) Appl. No.: 10/707,553

(22) Filed: Dec. 20, 2003

(51) Int. Cl.[7] .............................................. H01R 12/00
(52) U.S. Cl. .................... 439/78; 439/590; 439/936; 439/82; 439/83; 174/260; 174/52.2
(58) Field of Search ...................... 439/936, 78, 590, 439/82, 83; 174/52.2, 260, 267, 258; 257/787–796

(56) References Cited

U.S. PATENT DOCUMENTS

| | | | | |
|---|---|---|---|---|
| 5,185,498 A | * | 2/1993 | Sanftleben et al. | 174/52.2 |
| 5,518,427 A | * | 5/1996 | Kan et al. | 439/936 |
| 5,632,628 A | * | 5/1997 | Wagner | 439/78 |
| 5,735,697 A | * | 4/1998 | Muzslay | 439/936 |
| 5,825,633 A | * | 10/1998 | Bujalski et al. | 174/267 |
| 6,623,280 B2 | * | 9/2003 | Oldenburg et al. | 439/590 |
| 6,675,474 B2 | * | 1/2004 | Mitani et al. | 174/260 |

* cited by examiner

*Primary Examiner*—P. Austin Bradley
*Assistant Examiner*—Briggitte R. Hammond
(74) *Attorney, Agent, or Firm*—Bill C Panagos

(57) ABSTRACT

Disclosed is an electrical connector of the type fixedly attached to printed circuit boards having the male pins or terminals of the connector designed to go through corresponding bores in printed circuit boards that are then soldered to said board permanently establishing the desired electrical connections and further offering a high degree of resistance to humidity and, consequent humidity caused corrosion in the male pins or terminals through the novel use of ring-like projections around each male pin, stand-off supports, and a insulating and sealing resin filler.

2 Claims, 3 Drawing Sheets

CONNECTOR FOR PRINTED CIRCUIT BOARD

BACKGROUND OF INVENTION

1. Field of the Invention

This invention refers to an electrical connector of the type fixedly attached to printed circuit boards. More particularly the present invention is directed to a connector having the male pins or terminals of the connector designed to go through corresponding bores in printed circuit boards that are then soldered to said board permanently establishing the desired electrical connections.

More specifically the invention is directed to an electrical connector which offers a high degree of resistance to humidity and, consequent humidity caused corrosion in the male pins or terminals.

2. Description of the Related Art

When it is necessary to make a permanent multiple electrical connection on a printed circuit board, electrical connectors equipped with an electro-insulating body and having passing there through a number of male connector pins are used. These male connector pins extend outward from opposing surfaces of said body, so that the male connector pins on one side of said male terminal passing through the printed circuit board establish an electrical and mechanical connection by means of soldering said male connector pins to the printed circuit board. The other end of the male connector pins is used as a pin connector for subsequent connection complimentary female pin connector.

In certain practical applications of this type of electrical terminal connector, such as for example those used in the automotive industry, it is common to see the connector subjected to unfavorable environmental conditions. Such as, for example, humid environments, where the humidity generates corrosion of the male connector pins inserted into the printed circuit board.

More specifically the humidity generates electro-migration and corrosion effects, due to the different polarity existing between these male connector pins and the printed circuit board.

DISCLOSURE OF THE INVENTION

In accordance with one of the preferred embodiments of the present invention, the body of the terminal male connector has, preferably located at its body corners, support stanchions or legs that contact the surface of the printed circuit board when the connector is mounted on said printed circuit board, and which maintain the surface of the male terminal connector body slightly separated from said printed circuit board. Presently preferred is a separation distance of slightly less than about 1 mm. The interstices defined between the body of the connector and the printed circuit board, are filled with an electrically insulating resin fills and substantially seals this separation gap between the body of the connector and the mounting surface of the printed circuit board. This substantially eliminates the possibility of electro-migration and corrosion of the male connector pins of the terminal male connector.

In accordance with another aspect of the present invention the electro-insulating body of the male terminal connector has, on the surface opposite to the surface mounted to the printed circuit board, ring-shaped projections surrounding each of the male terminal pins. These ring-shaped projections establish barriers between the male terminal pins that substantially prevent or substantially retard the corrosion on this external side of the male terminal connector.

In yet another aspect of the present invention there is presented a terminal pin corrosion resistant connector for permanent mounting on a printed circuit board comprising a connector body having a plurality of bores for receiving a plurality of male terminal pins, and having located on the surface of said connector body adapted for mounting on said printed circuit board, around each opening of each of said bores tubular projections extending a desired distance outward from said body, and having integral supports stanchions extending outward from said surface adapted for mounting on said printed circuit board of said body a distance greater than the desired distance of said tubular projections a plurality of male terminal pins having two ends mounted in said plurality of bores in said connector body further characterized as having a male terminal adapted to accept a complimentary female terminal plug on one end and a male terminal adapted to be fixedly mounted thorough bores in a printed circuit board on the other end; and a thermo-insulating and moisture barrier resin sealing said area defined by the difference in distance between said stanchions and said tubular projections after said connector has been fixedly attached to said printed circuit board thereby substantially sealing said terminal pins from corrosion.

In still another aspect of the present invention there is presented a terminal pin corrosion resistant connector as described hereinabove, wherein said connector body is further characterized as having around the openings of said bores on the body surface adapted for receiving a female plug a raised body surface defining recesses around each of said bores.

DETAILED DESCRIPTION

Figure 1:
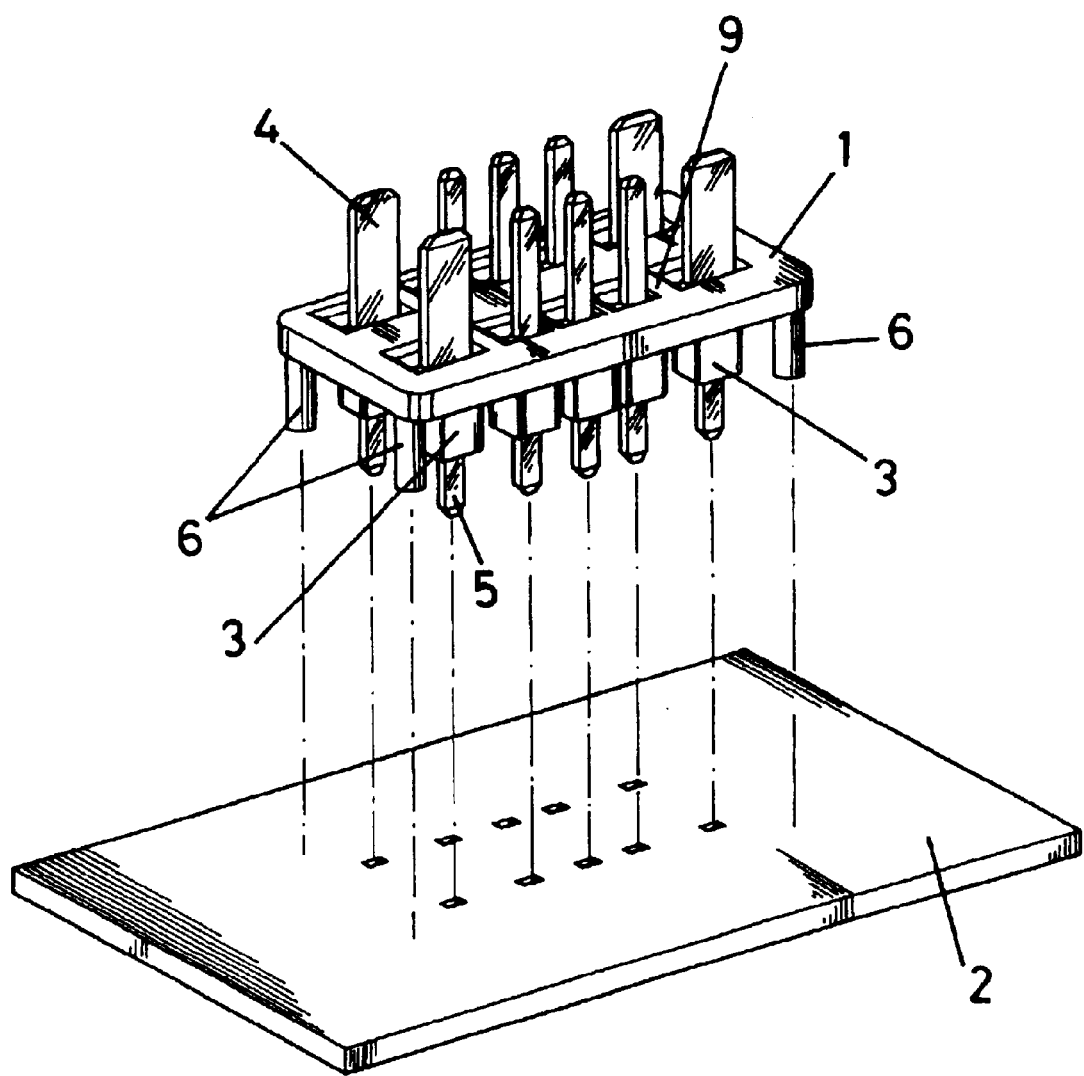
FIG. 1 shows a perspective view of a connector made in accordance with the present invention, aligned for mounting on a printed circuit board.
Figure 2:
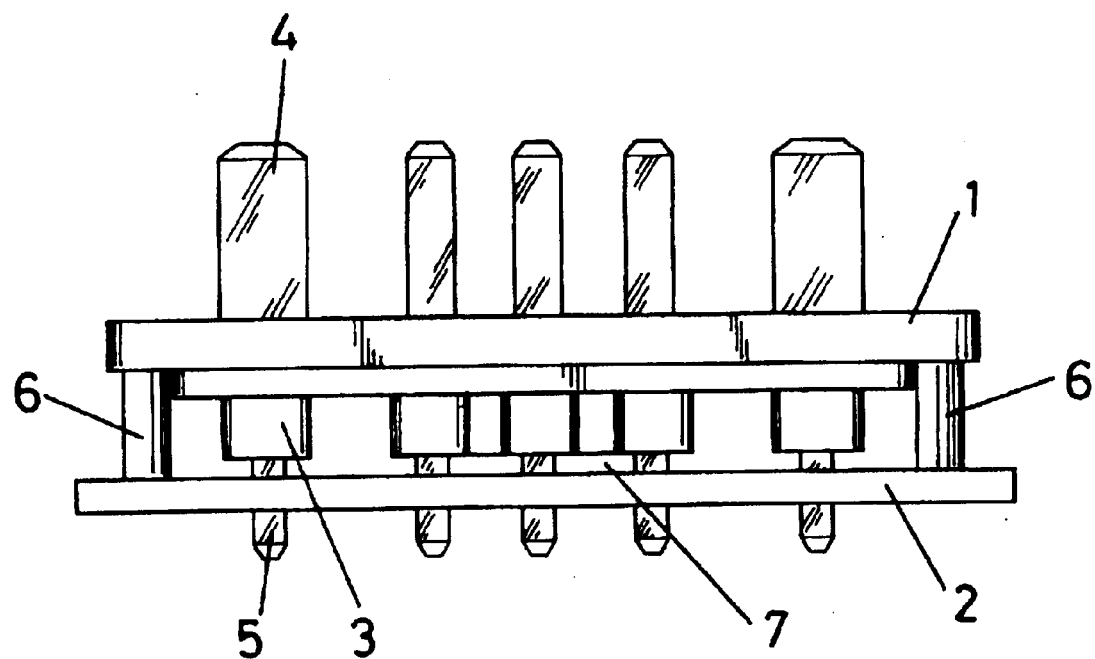
FIG. 2 shows a horizontal plan view of the connector of the present invention, following the assembly of the connector on the printed circuit board.
Figure 3:
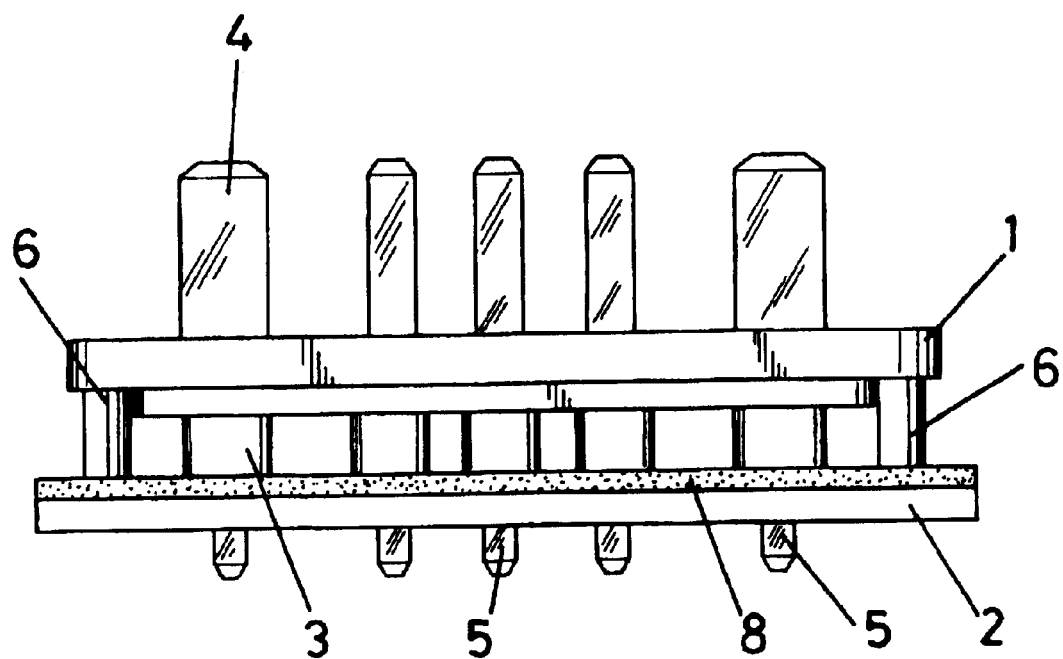
FIG. 3 shows a horizontal plan view of the connector mounted on the printed circuit board and having resin introduced into the gap between the connector projections surrounding the male pins and the surface of the printed circuit board.

Reference will now be made to the drawings, wherein to the extent possible like reference numerals are utilized to designate like components throughout the various views. In FIGS. 1, 2 and 3 there is shown a terminal connector of the present invention in position to be fixedly mounted on a circuit board (2) comprising an electro-insulating body (1), which includes a plurality of ring-like projections (3) on the terminal connector surface mating with the printed circuit board (2) through each of which pass a male terminal pin (4) which extend significantly downwards, each said male terminal pin (4) terminating in a circuit board male mating end (5), designed to pass through corresponding bores on the printed circuit board (2). Said mating ends (5) being fixedly attached to said circuit board (2) by any known fixedly attaching means, preferably by soldering, to provide appropriate electrical connections. On the external side of the connector (1) male terminals (4) define a male connector, able to receive a complementary female connector, (not shown).

In further accordance with the present invention, the body (1) includes on its surface mating with the printed circuit board (2) and preferably located at the corners of said body (1), supports (6) slightly longer than the projections (3), such that these supports (6) limit the degree of penetration of the male terminal pins (4) mating ends (5) through the complimentary bores of printed circuit board (2), with a gap (7), being defined between projections (3) and printed circuit board (2), following assembly of the terminal connector on the printed circuit board (2). Preferably the gap (7) having a distance of about 0.7 mm. This gap (7) being filled by a mass of resin (8) which acts as a bridge or electro-insulating filler between the body (1) and the printed circuit board (2), and which substantially completely protects the pins mating ends (5) from the effects of humidity.

Figure 4:
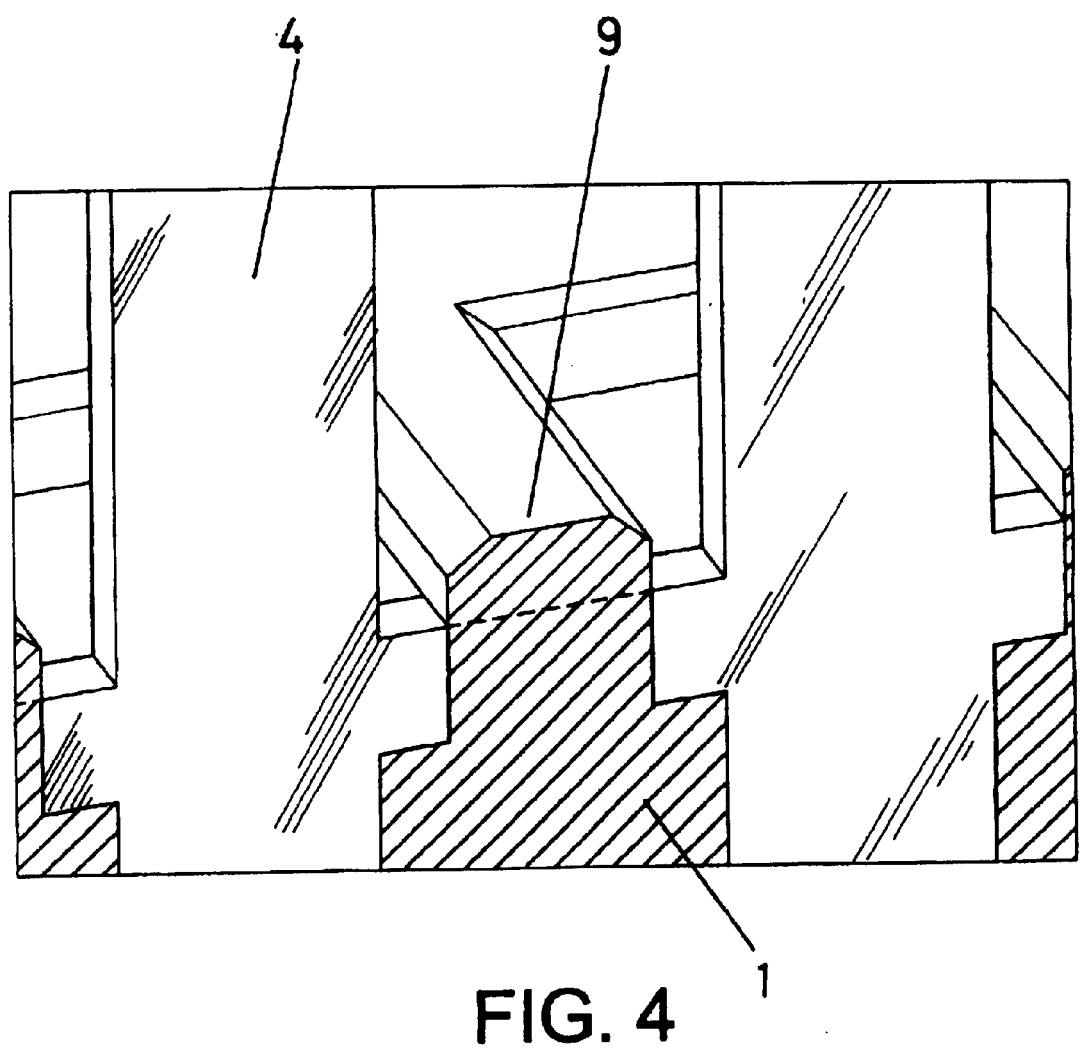
FIG. 4 shows an enlarged detail perspective view of a section of the connector of the present invention on the side opposite to that mounted to the printed circuit board.

On the other side of the body (1), specifically surrounding the one-piece male terminals (4) opposite said circuit board mating ends (5), are located exterior projections (9) which act as barriers between the male terminals (4), as can be seen in FIG. 4. These exterior projections 9 tend to inhibit both humidity and electro-migration between male terminals (4) reducing corrosion between male terminal ends (4) and thereby lengthening the useful life of the connector.

What is claimed is:

1. A terminal pin corrosion resistant connector for permanent mounting on a printed circuit board comprising:

a connector body having a plurality of bores for receiving a plurality of male terminal pins, and having located on the surface of said connector body adapted for mounting on said printed circuit board, around each opening of each of said bores tubular projections extending a desired distance outward from said body, and having integral supports stanchions extending outward from said surface adapted for mounting on said printed circuit board of said body a distance greater than the desired distance of said tubular projections;

a plurality of male terminal pins having two ends mounted in said plurality of bores in said connector body further characterized as having a male terminal adapted to accept a complimentary female terminal plug on one end and a male terminal adapted to be fixedly mounted thorough bores in a printed circuit board on the other end; and a thermo-insulating and moisture barrier resin sealing said area defined by the difference in distance between said stanchions and said tubular projections after said connector has been fixedly attached to said printed circuit board;

thereby substantially sealing said terminal pins from corrosion.

2. A terminal pin corrosion resistant connector as claimed in claim 1, wherein said connector body is further characterized as having around the openings of said bores on the body surface adapted for receiving a female plug a raised body surface defining recesses around each of said bores.

* * * * *